(12) United States Patent
Kitabayashi et al.

(10) Patent No.: US 10,679,873 B2
(45) Date of Patent: Jun. 9, 2020

(54) CERAMIC HEATER

(71) Applicant: NGK SPARK PLUG CO., LTD., Nagoya-shi, Aichi (JP)

(72) Inventors: Tetsuo Kitabayashi, Sendai (JP); Toshiyuki Endo, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 342 days.

(21) Appl. No.: 15/718,953

(22) Filed: Sep. 28, 2017

(65) Prior Publication Data
US 2018/0096868 A1    Apr. 5, 2018

(30) Foreign Application Priority Data

Sep. 30, 2016 (JP) .................. 2016-195050
Jun. 26, 2017 (JP) .................. 2017-124211
Sep. 5, 2017 (JP) .................. 2017-170427

(51) Int. Cl.
*H01L 21/67* (2006.01)
*H05B 3/28* (2006.01)

(52) U.S. Cl.
CPC ....... *H01L 21/67103* (2013.01); *H05B 3/283* (2013.01); *H05B 2203/002* (2013.01)

(58) Field of Classification Search
CPC .................. H01L 21/67103; H05B 3/283
USPC ...... 219/270, 443.1, 444.1, 468.2, 542, 548, 219/478, 552
See application file for complete search history.

(56) References Cited

U.S. PATENT DOCUMENTS

| | | | | |
|---|---|---|---|---|
| 1,669,005 A | * | 5/1928 | Hustadt | H05B 3/00 219/552 |
| 2,330,867 A | * | 10/1943 | Challet | F24C 15/106 219/458.1 |
| 4,002,883 A | * | 1/1977 | Hurko | H05B 3/748 219/543 |
| 5,294,778 A | * | 3/1994 | Carman | H01L 21/67103 118/725 |
| 5,344,492 A | * | 9/1994 | Sato | C23C 16/4586 118/724 |
| 5,904,872 A | * | 5/1999 | Arami | C23C 16/46 219/444.1 |
| 6,140,624 A | * | 10/2000 | Gilbert, Sr. | H05B 3/141 219/548 |

(Continued)

FOREIGN PATENT DOCUMENTS

JP    2012-160368 A    8/2012

*Primary Examiner* — Jimmy Chou
(74) *Attorney, Agent, or Firm* — Stites & Harbison, PLLC; Jeffrey A. Haeberlin; James R. Hayne

(57) ABSTRACT

The ceramic heater includes: a ceramic base body made of ceramic and having an upper surface on which an object to be heated is to be placed; a heating resistor included in the ceramic base body; and a cylindrical shaft made of ceramic and connected to a center part of a lower surface of the ceramic base body. The heating resistor includes six heating resistor element groups each including one or more connected heating resistor elements. Among these, three heating resistor element groups each have both ends each connected to the corresponding end of another one of the heating resistor element groups. Power feed terminals which respectively supply powers to a total of three ends composed of these both ends are connected to the total of three ends.

9 Claims, 9 Drawing Sheets

(56) References Cited

U.S. PATENT DOCUMENTS

| | | | | |
|---|---|---|---|---|
| 6,204,486 B1* | 3/2001 | Masaki | H01L 21/67103 | 219/444.1 |
| 6,207,305 B1* | 3/2001 | Nishioka | C04B 41/009 | 428/698 |
| 6,392,205 B1* | 5/2002 | Minonishi | H01L 21/67103 | 219/443.1 |
| 6,469,283 B1* | 10/2002 | Burkhart | H01L 21/67248 | 219/486 |
| 6,507,006 B1* | 1/2003 | Hiramatsu | H01L 21/67103 | 219/444.1 |
| 6,558,508 B1* | 5/2003 | Kawakami | H01L 21/67103 | 118/723 E |
| 6,740,853 B1* | 5/2004 | Johnson | C23C 16/4586 | 118/620 |
| 6,756,569 B2* | 6/2004 | Bates | H05B 1/0213 | 219/461.1 |
| 6,929,874 B2* | 8/2005 | Hiramatsu | B32B 18/00 | 219/544 |
| 7,115,839 B2* | 10/2006 | Goto | H01L 21/67103 | 219/444.1 |
| 7,126,092 B2* | 10/2006 | Lin | H01L 21/67103 | 219/444.1 |
| 7,394,043 B2* | 7/2008 | Kuibira | H05B 3/265 | 118/725 |
| 7,741,584 B2* | 6/2010 | Mariner | H05B 3/145 | 219/444.1 |
| 7,854,975 B2* | 12/2010 | Fujii | C04B 35/645 | 219/444.1 |
| 8,143,557 B2* | 3/2012 | Shibata | H01L 21/67103 | 219/444.1 |
| 8,168,926 B2* | 5/2012 | Goto | H05B 3/143 | 219/444.1 |
| 8,269,150 B2* | 9/2012 | Kim | H05B 3/748 | 219/443.1 |
| 8,304,701 B2* | 11/2012 | Akatsuka | H05B 3/143 | 118/427 |
| 8,344,291 B2* | 1/2013 | Donarski | H05B 1/0202 | 219/443.1 |
| 9,123,757 B2* | 9/2015 | Unno | H01L 21/68792 | |
| 9,748,120 B2* | 8/2017 | Crabb | H01L 21/67115 | |
| 2001/0027972 A1* | 10/2001 | Yamaguchi | H01L 21/67103 | 219/468.1 |
| 2002/0023914 A1* | 2/2002 | Kitagawa | H01L 21/67103 | 219/444.1 |
| 2002/0055021 A1* | 5/2002 | Niwa | C04B 35/581 | 428/698 |
| 2002/0063120 A1* | 5/2002 | Yamaguchi | H01L 21/67103 | 219/444.1 |
| 2002/0066726 A1* | 6/2002 | Cole, Sr. | G01R 31/2891 | 219/444.1 |
| 2002/0150789 A1* | 10/2002 | Hiramatsu | H01L 21/67103 | 428/688 |
| 2002/0153607 A1* | 10/2002 | Hiramatsu | H01L 21/67103 | 257/701 |
| 2002/0180466 A1* | 12/2002 | Hiramatsu | H01L 21/67103 | 324/719 |
| 2003/0015515 A1* | 1/2003 | Ito | H01L 21/67103 | 219/444.1 |
| 2003/0026060 A1* | 2/2003 | Hiramatsu | H01L 21/67103 | 361/311 |
| 2003/0038129 A1* | 2/2003 | Hiramatsu | H01L 21/67103 | 219/444.1 |
| 2003/0039796 A1* | 2/2003 | Ito | H01L 21/67103 | 428/66.6 |
| 2003/0044653 A1* | 3/2003 | Hiramatsu | B32B 18/00 | 428/704 |
| 2003/0075537 A1* | 4/2003 | Okajima | H01L 21/67103 | 219/444.1 |
| 2003/0121898 A1* | 7/2003 | Kane | C23C 16/4586 | 219/200 |
| 2003/0173349 A1* | 9/2003 | Unno | H01L 21/67103 | 219/444.1 |
| 2003/0186183 A1* | 10/2003 | Ito | H01L 21/67103 | 432/253 |
| 2003/0201264 A1* | 10/2003 | Kuibira | H01L 21/67103 | 219/444.1 |
| 2004/0035846 A1* | 2/2004 | Hiramatsu | H01L 21/67103 | 219/444.1 |
| 2004/0071945 A1* | 4/2004 | Ito | B32B 18/00 | 428/209 |
| 2004/0074899 A1* | 4/2004 | Mariner | H01L 21/67103 | 219/553 |
| 2004/0117977 A1* | 6/2004 | Hiramatsu | H01L 21/67103 | 29/611 |
| 2004/0144312 A1* | 7/2004 | Goto | C23C 16/46 | 118/715 |
| 2004/0155025 A1* | 8/2004 | Ito | H01L 21/67103 | 219/444.1 |
| 2004/0168641 A1* | 9/2004 | Kuibira | C23C 16/4409 | 118/728 |
| 2004/0188413 A1* | 9/2004 | Natsuhara | H01L 21/67103 | 219/444.1 |
| 2004/0206746 A1* | 10/2004 | Zhou | H05B 3/141 | 219/444.1 |
| 2004/0217104 A1* | 11/2004 | Gianoulakis | H01L 21/67103 | 219/443.1 |
| 2004/0222210 A1* | 11/2004 | Lin | H01L 21/67103 | 219/444.1 |
| 2004/0222211 A1* | 11/2004 | Hiramatsu | C04B 35/581 | 219/444.1 |
| 2004/0238520 A1* | 12/2004 | Kuibira | H01L 21/67103 | 219/390 |
| 2005/0077284 A1* | 4/2005 | Natsuhara | H01L 21/67103 | 219/444.1 |
| 2005/0242078 A1* | 11/2005 | Kuibira | H01L 21/67103 | 219/444.1 |
| 2005/0258160 A1* | 11/2005 | Goto | H01L 21/67103 | 219/270 |
| 2006/0011610 A1* | 1/2006 | Kondou | H05B 3/143 | 219/444.1 |
| 2006/0221539 A1* | 10/2006 | Morita | H01L 21/67103 | 361/234 |
| 2007/0039944 A1* | 2/2007 | Okajima | H01L 21/67103 | 219/465.1 |
| 2007/0221648 A1* | 9/2007 | Unno | F27D 3/0084 | 219/385 |
| 2008/0173638 A1* | 7/2008 | Mariner | H05B 3/145 | 219/553 |
| 2008/0237216 A1* | 10/2008 | Goto | H01L 21/67103 | 219/461.1 |
| 2008/0302781 A1* | 12/2008 | Murakami | C23C 16/4586 | 219/444.1 |
| 2009/0218316 A1* | 9/2009 | Kouzuma | H01L 21/67103 | 216/67 |
| 2011/0290782 A1* | 12/2011 | Donarski | F24C 15/105 | 219/443.1 |
| 2013/0068755 A1* | 3/2013 | Frutschy | H05B 3/141 | 219/542 |
| 2013/0071716 A1* | 3/2013 | Frutschy | H05B 1/0286 | 429/120 |
| 2013/0098895 A1* | 4/2013 | Swanson | H05B 3/20 | 219/508 |
| 2013/0105457 A1* | 5/2013 | Swanson | H05B 3/20 | 219/209 |
| 2013/0134148 A1* | 5/2013 | Tachikawa | H01L 21/67103 | 219/444.1 |
| 2013/0175257 A1* | 7/2013 | Lee | H05B 3/265 | 219/552 |
| 2013/0319762 A1* | 12/2013 | Harris | H01L 21/67103 | 174/94 R |

\* cited by examiner

CERAMIC HEATER

CROSS REFERENCE TO RELATED APPLICATIONS

The present application claims priority to Japanese Patent Application Nos. 2016-195050, 2017-124211, and 2017-170427 which were filed on Sep. 30, 2016, Jun. 26, 2017, and Sep. 5, 2017, respectively, the disclosures of which are herein incorporated by reference in their entirety.

BACKGROUND OF THE INVENTION

Field of the Invention

The present invention relates to a ceramic heater for heating an object to be heated, such as a semiconductor wafer.

Description of Related Art

One of ceramic heaters for heating an object to be heated such as a semiconductor wafer is disclosed in which a plurality of heating resistors are independently embedded inside a base body, current supplied to each heating resistor can be controlled independently, and the plurality of heating resistors are connected to at least one terminal, whereby the number of terminals is decreased (see, for example, Patent Document 1).

RELATED ART DOCUMENT

Patent Document 1 is Japanese Patent Application Laid-Open (kokai) No. 2012-160368.

BRIEF SUMMARY OF THE INVENTION

However, in the above conventional ceramic heater, power feed terminals for supplying current are connected to both ends of each heating resistor, and these power feed terminals need to be located in a hollow support member connected to the lower surface of the base body. If the number of the heating resistors increases, the diameter of the support member is enlarged in order to allow those power feed terminals to be located in the support member. However, if the joining area between the support member and the base body increases due to the enlarged diameter of the support member, heat escaping from the base body via the support member increases and this is not preferable.

The present invention has been made in view of the above circumstances, and an object of the present invention is to provide a ceramic heater that enables suppression of increase in the number of power feed terminals as compared to increase of the zones of heating resistors for which currents supplied thereto can be changed.

The present invention is a ceramic heater including: a ceramic base body made of ceramic and having an upper surface on which an object to be heated is to be placed; a heating resistor included in the ceramic base body; and a cylindrical support member made of ceramic and connected to a center part of a lower surface of the ceramic base body. The heating resistor includes three or more heating resistor element groups each including one or more connected heating resistor elements. Of the three or more heating resistor element groups, at least three heating resistor element groups each have both ends each directly connected to the corresponding end of another one of the at least three heating resistor element groups, and at least power feed terminals which respectively supply powers to a total of three ends composed of the both ends are connected to the total of three ends.

In other words, the present invention is a ceramic heater including: a ceramic base body made of ceramic and having an upper surface on which an object to be heated is to be placed and a lower surface opposite the upper surface; a cylindrical support member made of ceramic and connected to a center part of the lower surface of the ceramic base body; and a heating resistor embedded in the ceramic base body. The heating resistor includes three or more heating resistor element groups, with each heating resistor element group including one or more heating resistor elements. At least three of the three or more heating resistor element groups each have a first end and a second end, with the first end of each of the at least three of the three or more heating resistor element groups directly connected to the second end of another one of the at least three of the three or more heating resistor element groups. The ceramic heater further includes power feed terminals connected to, and supplying power to, each of the connected first and second ends of the at least three of the three or more heating resistor element groups.

According to the present invention, it becomes possible to control currents flowing through the heating resistor element groups, independently of each other, by using power adjustment means such as a three-phase power adjuster (three-phase thyristor), when supplying power, e.g., AC power, to the power feed terminals. Thus, heat generations of the heating resistor element groups can be controlled independently of each other, and the number of the power feed terminals can be decreased as compared to the conventional ceramic heater, so that the inner diameter of the support member can be reduced.

Instead of using the three-phase power adjuster, a power adjuster that adjusts power supplied to each power feed terminal by switching using DC power or single-phase AC power.

It is noted that, in the heating resistor, the one or more heating resistor elements may be connected in series or parallel.

In the present invention, preferably, the at least three heating resistor element groups are three heating resistor element groups, the both ends of the three heating resistor element groups are each directly connected to the corresponding end of another one of the three heating resistor element groups, and the total of three ends composed of the both ends are respectively grounded via the heating resistor element groups different from the three heating resistor element groups.

In the present invention, the at least three heating resistor element groups may be four heating resistor element groups, the both ends of the four heating resistor element groups may be each directly connected to the corresponding end of another one of the four heating resistor element groups, and the both ends may be each connected to the corresponding end of another one, of the heating resistor element groups, that is different from the four heating resistor element groups connected to the both ends.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

A ceramic heater 100 according to the first embodiment of the present invention will be described with reference to FIG. 1 to FIG. 3.

Figure 1:
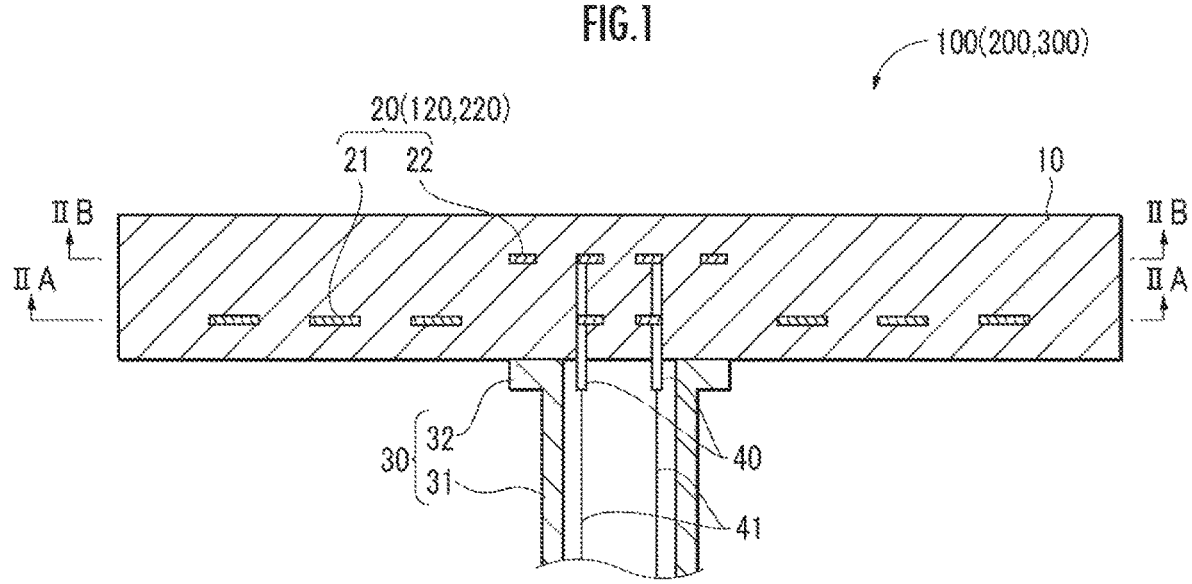
FIG. 1 is a schematic sectional view of a ceramic heater according to the first embodiment of the present invention.

As shown in FIG. 1, the ceramic heater 100 includes: a base body 10 formed of a substantially disk-like insulator for holding a wafer (substrate) (not shown); a heating resistor 20 embedded in the base body 10 so as not to cause short-circuit between resistors; and a hollow shaft (support member) 30 connected to the center part of the lower surface of the base body 10.

The shaft 30 roughly has a cylindrical shape, and has, at a part joined to the base body 10, a large diameter portion 32 which has a larger outer diameter than the other cylindrical portion 31. The upper surface of the large diameter portion 32 is a surface joined to the base body 10. The material of the shaft 30 may be equal to that of the base body 10, or for the purpose of enhancing a heat insulation property, may be formed from a material having a low thermal conductivity than that of the base body 10.

The lower surface of the base body 10 and the upper end surface of the shaft 30 are joined by diffusion joining, or solid phase joining using a joining material such as ceramic or glass. It is noted that the base body 10 and the shaft 30 may be connected by screwing, brazing, or the like.

It is noted that, as well as the heating resistor 20, at least one of an electrostatic chuck electrode for attracting a wafer to the placement surface by a Coulomb force and a plasma electrode for generating plasma above the base body 10, may be embedded in the base body 10.

In addition, via an appropriate low pass filter or high pass filter, the ceramic heater 100 may also serve as an electrostatic chuck for attracting a substrate to the surface of the base body 10 by a Coulomb force generated by voltage being applied from a power feed rod to the electrode.

Further, the ceramic heater 100 includes three power feed terminals 40 for supplying power to the heating resistor 20.

The power feed terminals 40 are respectively connected to power feed members (not shown) embedded in the base body 10, and the power feed members are connected to conductive wires passing through the inside of the shaft 30. It is noted that the power feed terminals 40 themselves may pass through the inside of the shaft 30, to be connected to conductive wires outside the shaft 30.

The power feed terminals 40 and the power feed members are brazed or welded with each other. The power feed terminals 40 are made of a heat resistant metal, such as nickel (Ni), Kovar (registered trademark) (Fe—Ni—Co), molybdenum (Mo), tungsten (W), or a heat resistant alloy mainly composed of molybdenum (Mo) and tungsten (W), which is formed in a foil shape, a plate shape, or a block shape. The power feed members are formed from molybdenum (Mo), tungsten (W), or the like.

The base body 10 is, for example, a ceramic sintered body formed from alumina, aluminum nitride, silicon nitride, or the like. The base body 10 may be manufactured by molding the above material in a mold having a predetermined shape and then forming the resultant molding into a disk shape by, for example, hot-press sintering, so as to be densified.

In the present embodiment, the heating resistor 20 is formed from a foil of a heat resistant metal such as molybdenum (Mo) or tungsten (W), and has a flat-surface shape. It is noted that the heating resistor 20 may be formed as a film, a plate, a wire, a mesh, a fiber, a coil, a ribbon, or the like made of a heat resistant metal.

The base body 10 is sintered with the heating resistor 20 embedded in the base body 10.

An example of a pattern of the heating resistor 20 will be described with reference to, mainly, FIG. 2(A) and FIG. 2(B).

With reference to FIG. 1, the heating resistor 20 includes a lower heating resistor 21 and an upper heating resistor 22 located above the lower heating resistor 21.

Here, the lower heating resistor 21 is composed of three heating resistor element groups 21A, 21B, 21C having ends directly connected to each other at a center O, and other ends A1, B1, C1 directly connected to the respective power feed terminals 40 near the center O.

Figure 2A:
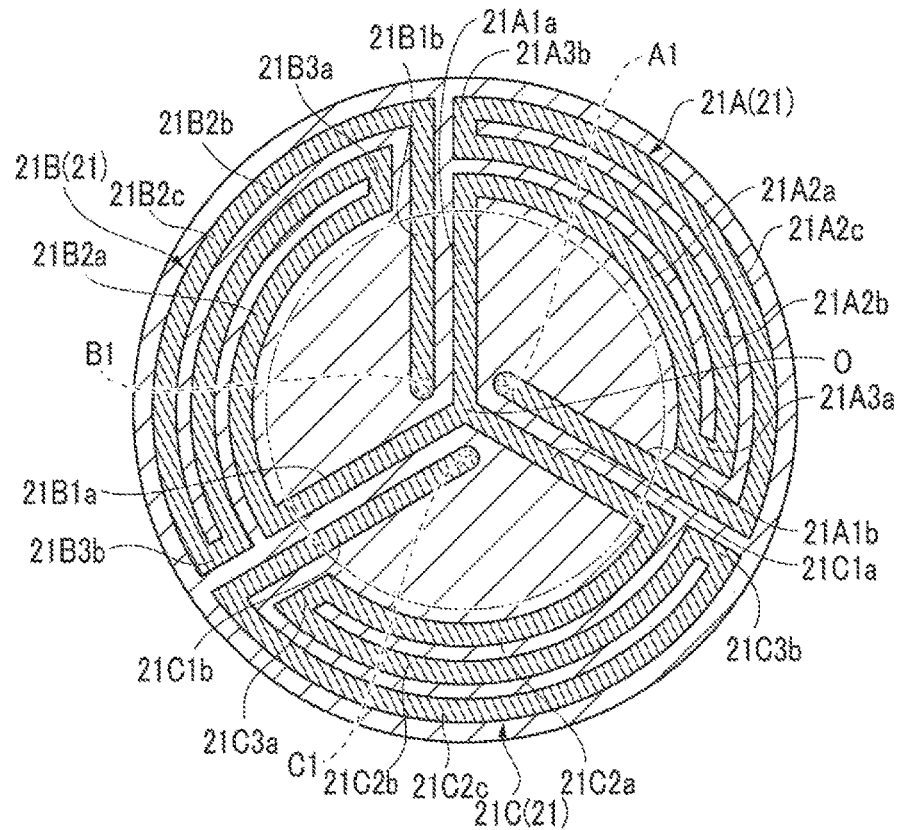
FIG. 2(A) is a schematic sectional view along IIA-IIA line in FIG. 1.
Figure 2B:
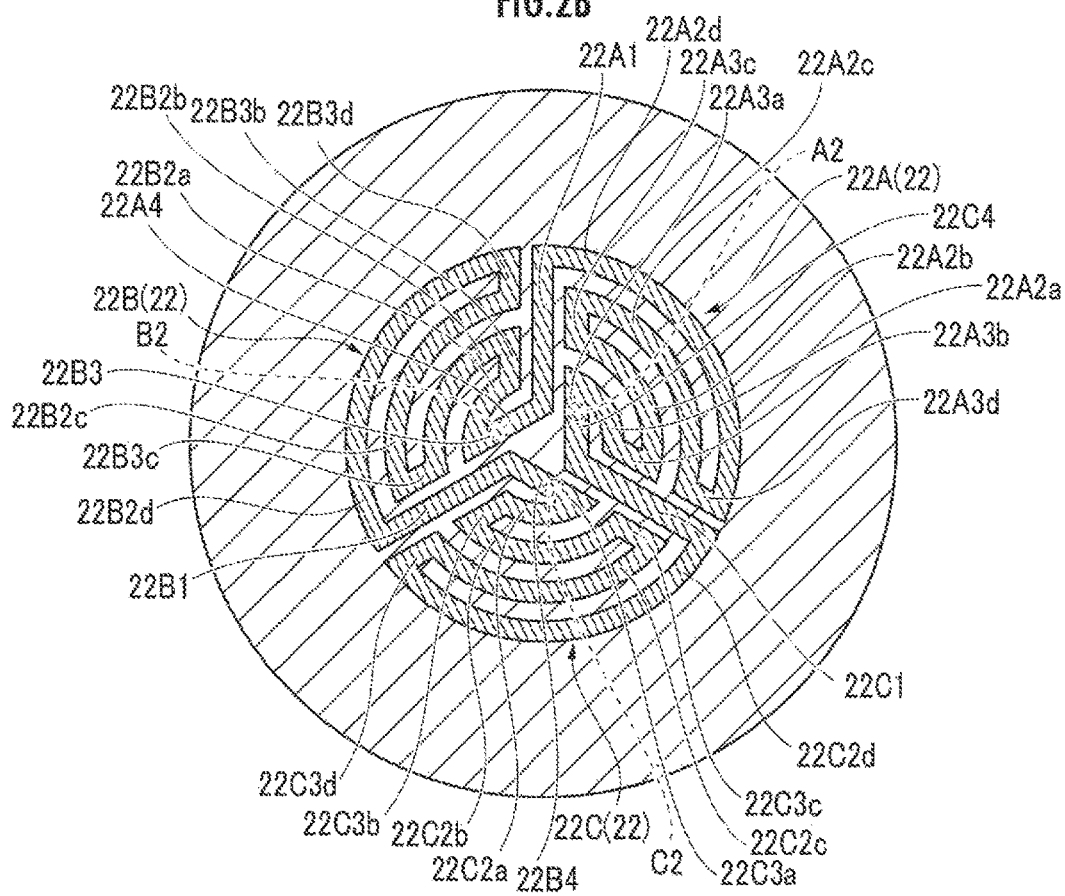
FIG. 2(B) is a schematic sectional view along IIB-IIB line in FIG. 1.

As shown in FIG. 2(A), if a direction in which a straight heating resistor element 21A1*a* extends straightly from the center O toward the peripheral side is defined as 0 o'clock direction, the heating resistor element group 21A exists in a fan-shaped region from 0 o'clock to 4 o'clock. The heating resistor element group 21A is composed of two straight heating resistor elements 21A1*a*, 21A1*b*, three arc-shaped heating resistor elements 21A2*a* to 21A2*c*, and two straight heating resistor elements 21A3*a*, 21A3*b*, which are connected in series.

Specifically, the straight heating resistor element 21A1*a* extends in a long straight shape in 0 o'clock direction from the center O to the peripheral side. A peripheral side end, of the straight heating resistor element 21A1*a*, which is opposite to the center O is connected to a 0 o'clock side end of the arc-shaped heating resistor element 21A2*a* which extends in an arc shape in the clockwise direction from 0 o'clock to 4 o'clock. A 4 o'clock side end of the arc-shaped heating resistor element 21A2*a* is connected to a center O side end of the straight heating resistor element 21A3*a* which extends in a short straight shape from the above 4 o'clock side end toward the peripheral side. A peripheral side end of the straight heating resistor element 21A3*a* is connected to a 4 o'clock side end of the arc-shaped heating resistor element 21A2*b* which extends in an arc shape in the counterclockwise direction from 4 o'clock to 0 o'clock.

A 0 o'clock side end of the arc-shaped heating resistor element 21A2*b* is connected to a center O side end of the straight heating resistor element 21A3*b* which extends in a short straight shape from the above 0 o'clock side end toward the peripheral side. A peripheral side end of the straight heating resistor element 21A3*b* is connected to a 0 o'clock side end of the arc-shaped heating resistor element 21A2*c* which extends in an arc shape in the clockwise direction from 0 o'clock to 4 o'clock. A 4 o'clock side end of the arc-shaped heating resistor element 21A2*c* is connected to a peripheral side end of the straight heating resistor element 21A1*b* which extends in a long straight shape from the above 4 o'clock side end roughly toward the center O. The straight heating resistor element 21A1*b* extends in a straight shape from the peripheral side end thereof to the end A1 positioned near the center O in 2 o'clock direction.

The heating resistor element group 21B exists in a fan-shaped region from 8 o'clock to 12 o'clock. The heating resistor element group 21B is composed of two straight heating resistor elements 21B1*a*, 21B1*b*, three arc-shaped heating resistor elements 21B2*a* to 21B2*c*, and two straight heating resistor elements 21B3*a*, 21B3*b*, which are connected in series.

The heating resistor element group 21C exists in a fan-shaped region from 4 o'clock to 8 o'clock. The heating resistor element group 21C is composed of two straight heating resistor elements 21C1*a*, 21C1*b*, three arc-shaped heating resistor elements 21C2*a* to 21C2*c*, and two straight heating resistor elements 21C3*a*, 21C3*b*, which are connected in series.

Specific configurations of the heating resistor element groups 21B, 21C are the same as that of the heating resistor element group 21A, and therefore the description thereof is omitted.

On the other hand, the upper heating resistor 22 is composed of three heating resistor element groups 22A, 22B, 22C connected to each other, the ends of which are directly connected to each other's ends, and these ends A2, B2, C2 are directly connected to the respective power feed terminals 40. In other words, each of the three heating resistor element groups 22A, 22B, 22C has a first end and a second end with the first end of each of the three heating resistor element groups 22A, 22B, 22C connected to the second end of another one of the three heating resistor element groups 22A, 22B, 22C.

The heating resistor element group 22A exists in a fan-shaped region from 0 o'clock to 4 o'clock. The heating resistor element group 22A is composed of one straight heating resistor element 22A1, four arc-shaped heating resistor elements 22A2*a* to 21A2*d*, four straight heating resistor elements 22A3*a* to 22A3*d*, and one straight connection heating resistor element 22A4, which are connected in series.

Specifically, the straight heating resistor element 22A3*a* extends in a short straight shape toward the peripheral side in 0 o'clock direction from the end A2 which is positioned directly above the end A1 and directly connected to the end A1. A peripheral side end of the straight heating resistor element 22A3*a* is connected to a 0 o'clock side end of the arc-shaped heating resistor element 22A2*a* which extends in an arc shape in the clockwise direction from 0 o'clock to 4 o'clock from the above peripheral side end. A 4 o'clock side end of the arc-shaped heating resistor element 22A2*a* is connected to a center side end of the straight heating resistor element 22A3*b* which extends in a short straight shape in 4 o'clock direction from the above 4 o'clock side end toward the peripheral side. A peripheral side end of the straight heating resistor element 22A3*b* is connected to a 4 o'clock side end of the arc-shaped heating resistor element 22A2*b* which extends in an arc shape in the counterclockwise direction from 4 o'clock to 0 o'clock.

A 0 o'clock side end of the arc-shaped heating resistor element 22A2*b* is connected to a center side end of the straight heating resistor element 22A3*c* which extends in a short straight shape in 0 o'clock direction from the above 0 o'clock side end toward the peripheral side. A peripheral side end of the straight heating resistor element 22A3*c* is connected to a 0 o'clock side end of the arc-shaped heating resistor element 22A2*c* which extends in an arc shape in the clockwise direction from 0 o'clock to 4 o'clock. A 4 o'clock side end of the arc-shaped heating resistor element 22A2*c* is connected to a center side end of the straight heating resistor element 22A3*d* which extends in a short straight shape in 4 o'clock direction from the above 4 o'clock side end toward the peripheral side. A peripheral side end of the straight heating resistor element 22A3*d* is connected to a 4 o'clock side end of the arc-shaped heating resistor element 22A2*d* which extends in an arc shape in the counterclockwise direction from 4 o'clock to 0 o'clock.

A 0 o'clock side end of the arc-shaped heating resistor element 22A2*d* is connected to a peripheral side end of the straight heating resistor element 22A1 which extends in a long straight shape in 0 o'clock direction from the above 0 o'clock side end toward the center side. A center side end of the straight heating resistor element 22A1 is connected to a 2 o'clock side end of the straight connection heating resistor element 22A4 which extends in a short straight shape in 8 o'clock direction from the above center side end. The straight connection heating resistor element 22A4 extends in a straight shape from the 2 o'clock side end thereof to the end B2 of the heating resistor element group 22B.

The heating resistor element group 22B exists in a fan-shaped region from 8 o'clock to 12 o'clock. The heating resistor element group 22B is composed of one straight heating resistor element 22B1, four arc-shaped heating resistor elements 22B2*a* to 21B2*d*, four straight heating resistor elements 22B3*a* to 22B3*d*, and one straight connection heating resistor element 22B4, which are connected in series.

The heating resistor element group 22C exists in a fan-shaped region from 4 o'clock to 8 o'clock. The heating resistor element group 22C is composed of one straight heating resistor element 22C1, four arc-shaped heating resistor elements 22C2*a* to 21C2*d*, four straight heating resistor elements 22C3*a* to 22C3*d*, and one straight connection heating resistor element 22C4, which are connected in series.

Specific configurations of the heating resistor element groups 22B, 22C are the same as that of the heating resistor element group 22A, and therefore the description thereof is omitted.

It is preferable that, as shown by a two-dot chain line in FIG. 2(A), the outer edge of the region of the upper heating resistor 22 is positioned inside the arc-shaped heating resistor elements composing the lower heating resistor 21.

An equivalent circuit diagram of the heating resistor 20 configured as described above is schematically shown in FIG. 3. As shown FIG. 3, the center O of the heating resistor 20 is grounded (earthed) and the heating resistor 20 has a Y (star) connection structure formed from six zones of heating resistor element groups 21A, 21B, 21C, 22A, 22B, 22C.

Power feed terminals of an AC three-phase power supply are connected via the conductive wires and the power feed members to a total of three power feed terminals, i.e., the power feed terminal 40 directly connected to the ends A1, A2, the power feed terminal 40 directly connected to the ends B1, B2, and the power feed terminal 40 directly connected to the ends C1, C2. Thus, it becomes possible to control currents flowing through the heating resistor element groups 21A, 21B, 21C, 22A, 22B, 22C, independently of each other, by using power adjustment means such as a three-phase power adjuster (three-phase thyristor). Of the three heating resistor element groups 22A, 22B, 22C, for example, the heating resistor element group 22A corresponds to a "first heating resistor element group", the heating resistor element group 22B corresponds to a "second heating resistor element group", and the heating resistor element group 22C corresponds to a "third heating resistor element group".

Thus, the number of the power feed terminals 40 is only three as compared to six zones of the heating resistor element groups 21A, 21B, 21C, 22A, 22B, 22C. Therefore, the inner diameter of the shaft 30 can be reduced. It is noted that a common earth terminal may be provided among the heating resistor element groups 21A, 21B, 21C. In this case, the number of the power feed terminals is four, which is still not greater than the number of the zones.

B. Second Embodiment

Next, a ceramic heater 200 according to the second embodiment of the present invention will be described with reference to, mainly, FIG. 4 and FIG. 5. The ceramic heater 200 is similar to the ceramic heater 100 described above, and therefore only a difference therebetween will be described.

With reference to FIG. 1, the ceramic heater 200 includes: a base body 10 formed of a substantially disk-like insulator for attracting and holding a wafer (substrate) (not shown); a heating resistor 120 embedded in the base body 10 so as not to cause short-circuit between resistors; and a hollow shaft 130 connected to the center part of the lower surface of the base body 10.

Further, the ceramic heater 200 includes three power feed terminals 40 for supplying power to the heating resistor 120.

An example of a pattern of the heating resistor 120 will be described with reference to FIG. 4.

Here, the heating resistor 120 is composed of: three heating resistor element groups 121A, 121B, 121C having ends X, Y, Z positioned near the center O; and three heating resistor element groups 122A, 122B, 122C having ends positioned at the center O, and other ends directly connected to other ends, different from the ends X, Y, Z, of the heating resistor element groups 121A, 121B, 121C.

Figure 4:
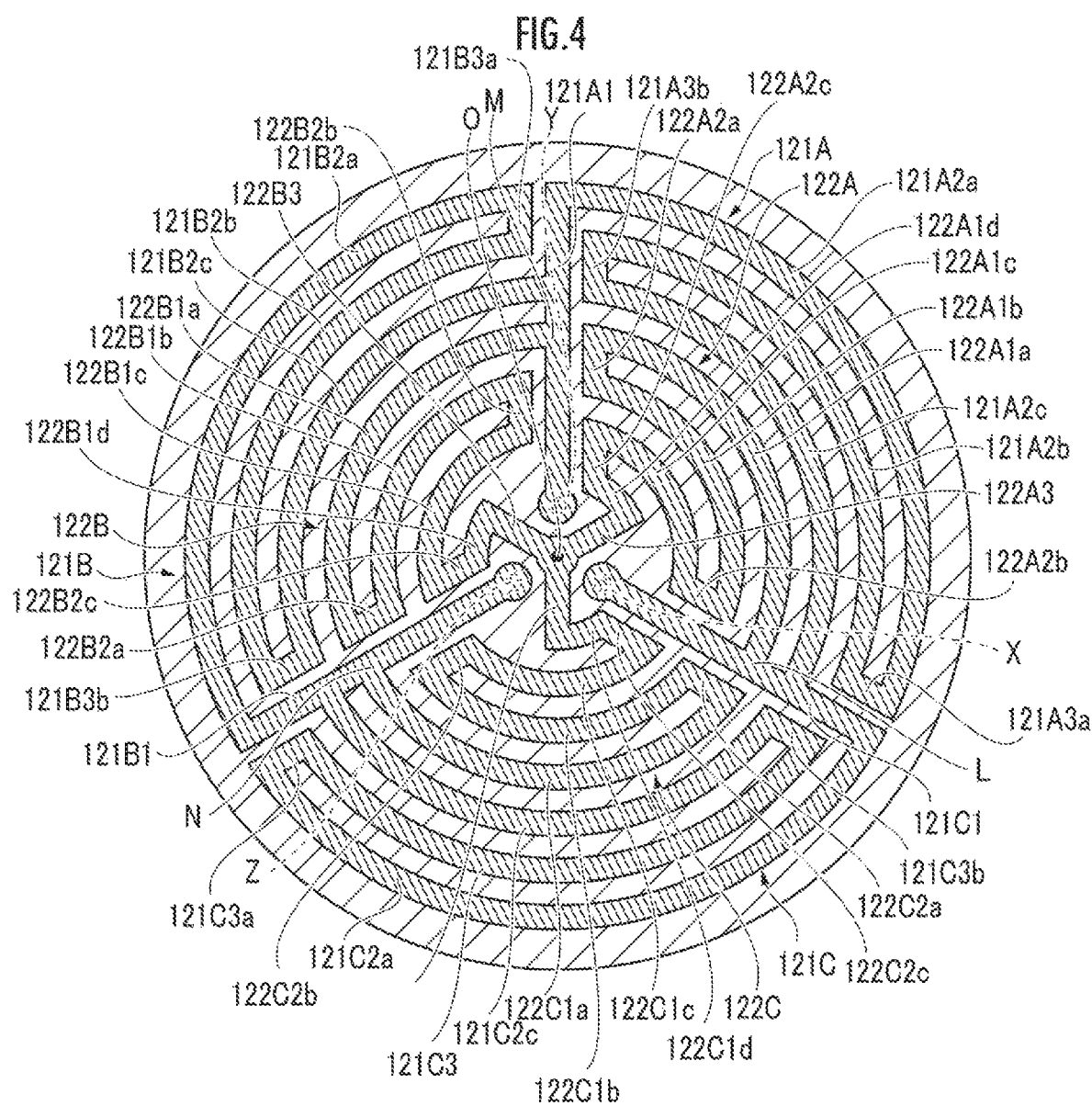
FIG. 4 is a schematic sectional view of a heating resistor according to the second embodiment of the present invention.

As shown in FIG. 4, if a direction in which a straight heating resistor element 121A1 extending straightly from the end Y extends toward the peripheral side is defined as 0 o'clock direction, the heating resistor element group 121A exists in the peripheral side part of a fan-shaped region from 0 o'clock to 4 o'clock. The heating resistor element group 121A is composed of one straight heating resistor element 121A1, three arc-shaped heating resistor elements 121A2a to 121A2c, and two straight heating resistor elements 121A3a, 121A3b, which are connected in series.

Specifically, the straight heating resistor element 121A1 extends in a long straight shape in 0 o'clock direction from the end Y positioned slightly away from the center O in 0 o'clock direction, to the peripheral side. A peripheral side end, of the straight heating resistor element 121A1, which is opposite to the end Y is connected to a 0 o'clock side end of the arc-shaped heating resistor element 121A2a which extends in an arc shape in the clockwise direction from 0 o'clock to 4 o'clock from the above peripheral side end. A 4 o'clock side end of the arc-shaped heating resistor element 121A2a is connected to a peripheral side end of the straight heating resistor element 121A3a which extends in a short straight shape in 10 o'clock direction from the above 4 o'clock side end toward the center O. A center O side end of the straight heating resistor element 121A3a is connected to a 4 o'clock side end of the arc-shaped heating resistor element 121A2b which extends in an arc shape in the counterclockwise direction from 4 o'clock to 0 o'clock from the above center O side end.

A 0 o'clock side end of the arc-shaped heating resistor element 121A2b is connected to a peripheral side end of the straight heating resistor element 121A3b which extends in a short straight shape in 6 o'clock direction from the above 0 o'clock side end toward the center O. A center O side end of the straight heating resistor element 121A3b is connected to a 0 o'clock side end of the arc-shaped heating resistor element 121A2c which extends in an arc shape in the clockwise direction from 0 o'clock to 4 o'clock from the above center O side end. A 4 o'clock side end of the arc-shaped heating resistor element 121A2c is connected to a middle part of a straight heating resistor element 121C1 of the heating resistor element group 121C.

The heating resistor element group 121B exists in a peripheral side part of a fan-shaped region from 8 o'clock to 12 o'clock. The heating resistor element group 121B is composed of one straight heating resistor element 121B1, three arc-shaped heating resistor elements 121B2a to 121B2c, and two straight heating resistor elements 121B3a, 121B3b, which are connected in series.

The heating resistor element group 121C exists in a peripheral side part of a fan-shaped region from 4 o'clock to 8 o'clock. The heating resistor element group 121C is composed of one straight heating resistor element 121C1, three arc-shaped heating resistor elements 121C2a to 121C2c, and two straight heating resistor elements 121C3a, 121C3b, which are connected in series.

Specific configurations of the heating resistor element groups 121B, 121C are the same as that of the heating resistor element group 121A, and therefore the description thereof is omitted.

The heating resistor element group 122A exists in the inner circumferential side part of a fan-shaped region from 0 o'clock to 4 o'clock. The heating resistor element group 122A is composed of four arc-shaped heating resistor elements 122A1a to 122A1d, three straight heating resistor elements 122A2a to 122A2c, and one straight center heating resistor element 122A3, which are connected in series.

Specifically, the arc-shaped heating resistor element 122A1a extends in an arc shape in the counterclockwise direction from 4 o'clock to 0 o'clock from a middle part L of the straight heating resistor element 121C1. A 0 o'clock side end of the arc-shaped heating resistor element 122A1a is connected to a peripheral side end of the straight heating resistor element 122A2a which extends in a short straight shape in 0 o'clock direction from the above 0 o'clock side end toward the center O side. A center O side end of the straight heating resistor element 122A2a is connected to a 6 o'clock side end of the arc-shaped heating resistor element 122A1*b* which extends in an arc shape in the clockwise direction from 0 o'clock to 4 o'clock from the above center O side end.

A 4 o'clock side end of the arc-shaped heating resistor element 122A1*b* is connected to a peripheral side end of the straight heating resistor element 122A2*b* which extends in a short straight shape in 4 o'clock direction from the above 4 o'clock side end toward the center O side. A center O side end of the straight heating resistor element 122A2*b* is connected to a 10 o'clock side end of the arc-shaped heating resistor element 122A1*c* which extends in an arc shape in the counterclockwise direction from 4 o'clock to 0 o'clock from the above center O side end.

A 0 o'clock side end of the arc-shaped heating resistor element 122A1*c* is connected to a peripheral side end of the straight heating resistor element 122A2*c* which extends in a short straight shape in 0 o'clock direction from the above 0 o'clock side end toward the center O side. A center O side end of the straight heating resistor element 122A2*c* is connected to a 0 o'clock side end of the arc-shaped heating resistor element 122A1*d* which extends in an arc shape in the clockwise direction from 0 o'clock to 2 o'clock from the above center O side end. A 2 o'clock side end of the arc-shaped heating resistor element 122A2*d* is connected to a peripheral side end of the straight center heating resistor element 122A3 which extends in a short straight shape in 8 o'clock direction from the above 2 o'clock side end to the center O.

The heating resistor element group 122B exists in the inner circumferential side part of a fan-shaped region from 8 o'clock to 12 o'clock. The heating resistor element group 122B is composed of four arc-shaped heating resistor elements 122B1*a* to 122B1*d*, three straight heating resistor elements 122B2*a* to 122B2*c*, and one straight center heating resistor element 122B3, which are connected in series.

The heating resistor element group 122C exists in the inner circumferential side part of a fan-shaped region from 4 o'clock to 8 o'clock. The heating resistor element group 122C is composed of four arc-shaped heating resistor elements 122C1*a* to 122C1*d*, three straight heating resistor elements 122C2*a* to 122C2*c*, and one straight center heating resistor element 122C3, which are connected in series.

Specific configurations of the heating resistor element groups 122B, 122C are the same as that of the heating resistor element group 122A, and therefore the description thereof is omitted.

An equivalent circuit diagram of the heating resistor 120 configured as described above is schematically shown in FIG. 5. As shown in FIG. 5, the center O of the heating resistor 120 is grounded (earthed) and the heating resistor 120 has a Y (star) connection structure formed from six zones of heating resistor element groups 121A, 121B, 121C, 122A, 122B, 122C.

Power feed terminals of an AC three-phase power supply are connected via the conductive wires and the power feed members to a total of three power feed terminals 40 directly connected to the ends X, Y, Z. Thus, it becomes possible to control currents flowing through the heating resistor element groups 121A, 121B, 121C, 122A, 122B, 122C, independently of each other, by using power adjustment means such as a three-phase power adjuster (three-phase thyristor). Of the three heating resistor element groups 121A, 121B, 121C, for example, the heating resistor element group 121A corresponds to a "first heating resistor element group", the heating resistor element group 121B corresponds to a "second heating resistor element group", and the heating resistor element group 121C corresponds to a "third heating resistor element group".

Thus, the number of the power feed terminals 40 is only three as compared to six zones of the heating resistor element groups 121A, 121B, 121C, 122A, 122B, 122C. Therefore, the inner diameter of the shaft 30 can be reduced.

It is noted that a common earth terminal may be provided among the heating resistor element groups 122A, 122B, 122C. In this case, the number of the power feed terminals is four, which is still not greater than the number of the zones.

Figure 5:
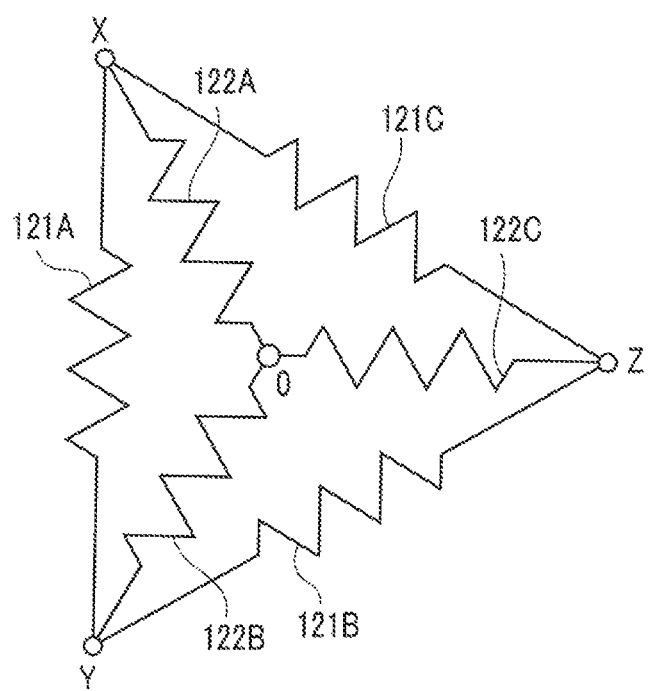
FIG. 5 is a schematic equivalent circuit diagram of the heating resistor.

As is understood from FIG. 5, it is preferable that the heating resistor element groups 121A, 121C, 122A are connected at one point of the end X, for example. However, as is understood from FIG. 4, the heating resistor element groups 121A, 121C are connected at the middle part of the straight heating resistor element 121C1, and the heating resistor element groups 121A, 122A are connected at the middle part L of the straight heating resistor element 121C1, and thus a part of the straight heating resistor element 121C1 is shared. Therefore, it is preferable that part from the end X to the middle part L and part to the intersection with the heating resistor element group 121A have as small resistance values as possible. The same applies to part from the end Y to a middle part M and part to the intersection with the heating resistor element group 121B, and a part from the end Z to a middle part N and part to the intersection with the heating resistor element group 121C.

Thus, the present embodiment has a feature that the entire heating resistor 120 can be arranged in the same plane in the base body 10.

C. Third Embodiment

Next, a ceramic heater 300 according to the third embodiment of the present invention will be described with reference to FIG. 6 to FIG. 8.

With reference to FIG. 1, the ceramic heater 300 includes: a base body 10 formed of a substantially disk-like insulator for attracting and holding a wafer (substrate) (not shown); a heating resistor 220 embedded in the base body 10; and a hollow shaft 30 connected to the center part of the lower surface of the base body 10.

Further, the ceramic heater 300 includes a plurality of power feed terminals 40 for supplying power to the heating resistor 220.

An example of a pattern of the heating resistor 220 will be described with reference to FIG. 6, FIG. 7(A), and FIG. 7(B).

The heating resistor 220 includes a lower heating resistor 221, a middle heating resistor 222 located above the lower heating resistor 221, and an upper heating resistor 223 located above the middle heating resistor 222.

Here, the lower heating resistor 221 is composed of four heating resistor element groups 221A, 221B, 221C, 221D directly connected to ends A1, B1, C1, D1, respectively.

Figure 6:
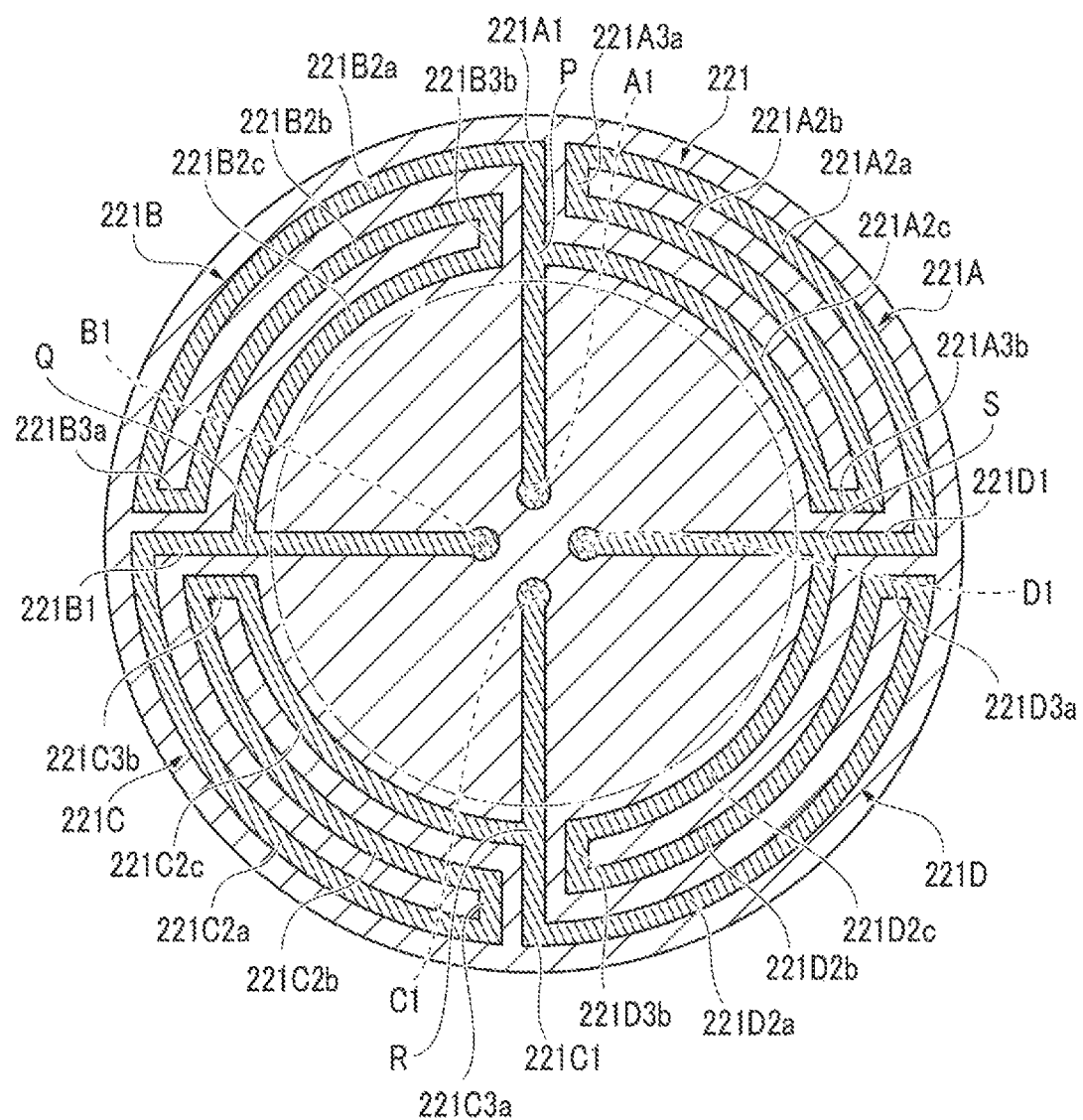
FIG. 6 is a schematic sectional view of a lower heating resistor according to the third embodiment of the present invention.

As shown in FIG. 6, if a direction in which a straight heating resistor element 221A1 extends straightly toward the peripheral side from the end A1 positioned near the center is defined as 0 o'clock direction, the heating resistor element group 221A exists in the peripheral side part of a fan-shaped region from 0 o'clock to 3 o'clock. The heating resistor element group 221A is composed of one straight heating resistor element 221A1, three arc-shaped heating resistor elements 221A2*a* to 221A2*c*, and two straight heating resistor elements 221A3*a*, 221A3*b*, which are connected in series.

Specifically, the straight heating resistor element 221A1 extends in a long straight shape in 0 o'clock direction from the end A1 toward the peripheral side. A middle part P of the straight heating resistor element 221A1 is connected to a 0 o'clock side end of the arc-shaped heating resistor element 221A2*a* which extends in an arc shape in the clockwise direction from 0 o'clock to 3 o'clock from the middle part P. A 3 o'clock side end of the arc-shaped heating resistor element 221A2*c* is connected to a center side end of the straight heating resistor element 221A3*b* which extends in a short straight shape in 3 o'clock direction from the above 3 o'clock side end toward the peripheral side. A peripheral side end of the short straight heating resistor element 221A3*b* is connected to a 3 o'clock side end of the arc-shaped heating resistor element 221A2*b* which extends in an arc shape in the counterclockwise direction from 3 o'clock to 0 o'clock from the above peripheral side end.

A 0 o'clock side end of the arc-shaped heating resistor element 221A2*b* is connected to a center side end of the straight heating resistor element 221A3*a* which extends in a short straight shape in 0 o'clock direction from the above 0 o'clock side end toward the peripheral side. A peripheral side end of the straight heating resistor element 221A3*a* is connected to a 0 o'clock side end of the arc-shaped heating resistor element 221A2*a* which extends in an arc shape in the clockwise direction from 0 o'clock to 3 o'clock from the above peripheral side end. A 3 o'clock side end of the arc-shaped heating resistor element 221A2*a* is connected to a peripheral side end of the straight heating resistor element 221D1 of the heating resistor element group 221D.

The heating resistor element group 221B exists in the peripheral side part of a fan-shaped region from 9 o'clock to 12 o'clock. The heating resistor element group 221B is composed of one straight heating resistor element 221B1, three arc-shaped heating resistor elements 221B2*a* to 221B2*c*, and two straight heating resistor elements 221B3*a*, 221B3*b*, which are connected in series.

The heating resistor element group 221C exists in the peripheral side part of a fan-shaped region from 6 o'clock to 9 o'clock. The heating resistor element group 221C is composed of one straight heating resistor element 221C1, three arc-shaped heating resistor elements 221C2*a* to 221C2*c*, and two straight heating resistor elements 221C3*a*, 221C3*b*, which are connected in series.

The heating resistor element group 221D exists in the peripheral side part of a fan-shaped region from 3 o'clock to 6 o'clock. The heating resistor element group 221D is composed of one straight heating resistor element 221D1, three arc-shaped heating resistor elements 221D2*a* to 221D2*c*, and two straight heating resistor elements 221D3*a*, 221D3*b*, which are connected in series.

Specific configurations of the heating resistor element group 221B to 221D are the same as that of the heating resistor element group 221A, and therefore the description thereof is omitted.

The middle heating resistor 222 is composed of one heating resistor element group 222 having, as both ends thereof, ends A2, C2 positioned directly above the ends A1, C1 and directly connected to the ends A1, C1, respectively.

Figure 7A:
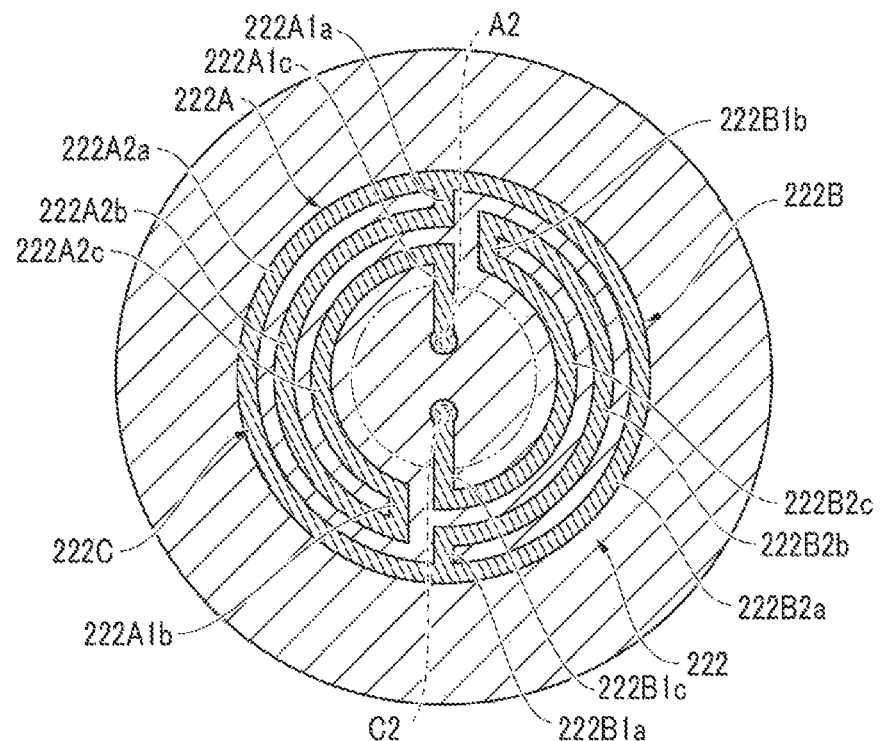
FIG. 7(A) is a schematic sectional view of a middle heating resistor.

As shown in FIG. 7(A), the heating resistor element group 222 exists in a ring-shaped region. The heating resistor element group 222 is composed of: a first heating resistor element group 222A composed of three straight heating resistor elements 222A1*a* to 222A1*c* and two semi-circular heating resistor elements 222A2*b*, 222A2*c*; a second heating resistor element group 222B composed of three straight heating resistor elements 222B1*a* to 222B1*c* and two semi-circular heating resistor elements 222B2*b*, 222B2*c*; and one ring-shaped heating resistor element 222C, and these heating resistor elements are connected to each other.

If a direction in which the straight heating resistor element 222A1*c* extends straightly toward the peripheral side from the end A2 positioned near the center is defined as 0 o'clock direction, the first heating resistor element group 222A exists in the peripheral side part of a left-half semi-circular fan-shaped region.

Specifically, the straight heating resistor element 222A1*c* exists in a long straight shape in 0 o'clock direction from the end A2 toward the peripheral side. A peripheral side end of the straight heating resistor element 222A1*c* is connected to a 0 o'clock side end of the semi-circular heating resistor element 222A2*c* which extends in a semi-circular shape in the counterclockwise direction from 0 o'clock to 6 o'clock from the above peripheral side end. A 6 o'clock side end of the semi-circular heating resistor element 222A2*c* is connected to a center side end of the straight heating resistor element 222A1*b* which extends in a short straight shape in 6 o'clock direction from the above 6 o'clock side end toward the peripheral side. A peripheral side end of the straight heating resistor element 222A1*b* is connected to a 6 o'clock side end of the semi-circular heating resistor element 222A2*b* which extends in a semi-circular shape in the clockwise direction from 6 o'clock to 12 o'clock from the above peripheral side end. A 12 o'clock side end of the semi-circular heating resistor element 222A2*b* is connected to a center side end of the straight heating resistor element 222A1*a* which extends in a short straight shape in 12 o'clock direction from the above 12 o'clock side end toward the peripheral side. The straight heating resistor element 222A1*a* extends in a short straight shape in 0 o'clock direction from the center side end thereof toward the peripheral side, and a peripheral side end thereof is connected to a middle part, of the ring-shaped heating resistor element 222C, positioned in 0 o'clock direction.

A specific configuration of the second heating resistor element group 222B is the same as that of the first heating resistor element group 222A, and therefore the description thereof is omitted.

It is preferable that, as shown by a two-dot chain line in FIG. 6, the outer edge of the region of the middle heating resistor 222 is positioned inside the arc-shaped heating resistor elements composing the lower heating resistor 221.

The lower heating resistor 223 is composed of one heating resistor element group 223 having, as both ends thereof, ends B2, D2 positioned directly above the ends B1, D1 and directly connected to the ends B1, D1.

Figure 7B:
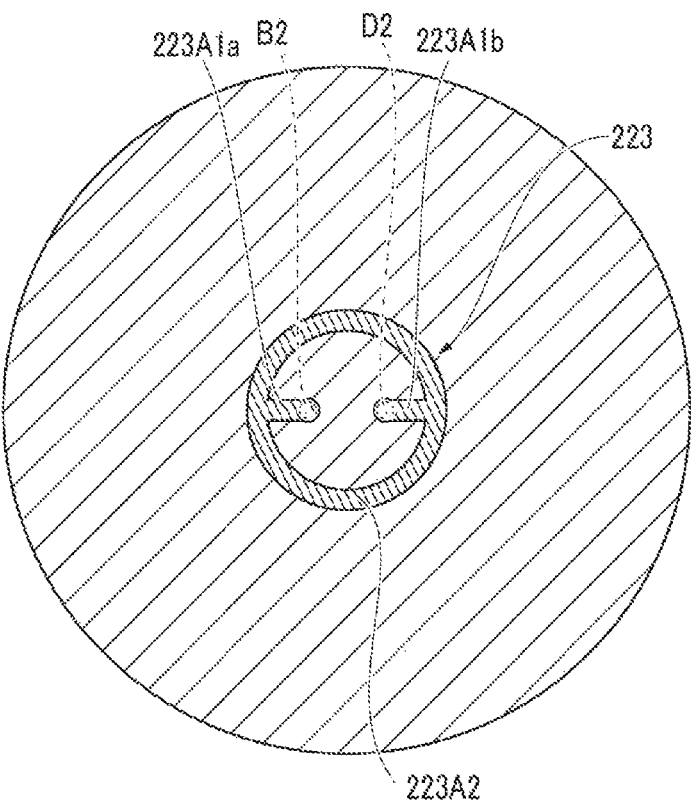
FIG. 7(B) is a schematic sectional view of an upper heating resistor.

As shown in FIG. 7(B), the heating resistor element group 223 exists in a ring-shaped region. The heating resistor element group 223 is composed of two straight heating resistor elements 223A1*a*, 223A1*b* and one ring-shaped heating resistor element 223A2, which are connected to each other.

Specifically, in the heating resistor element group 223, if a direction in which the straight heating resistor element 223A1*a* extends straightly toward the peripheral side from the end B2 positioned near the center is defined as 9 o'clock direction, a peripheral side end of the straight heating resistor element 223A1*a* is connected to a 9 o'clock side middle part of the ring-shaped heating resistor element 222A2. A 3 o'clock side middle part of the ring-shaped heating resistor element 223A2 is connected to a peripheral side end of the straight heating resistor element 223A1*b* which extends in a short straight shape in 9 o'clock direction from the 3 o'clock side middle part. The straight heating resistor element 223A1*b* extends toward the center side to reach the end D2.

It is preferable that, as shown by a two-dot chain line in FIG. 7(A), the outer edge of the region of the upper heating resistor 223 is positioned inside the arc-shaped heating resistor elements composing the middle heating resistor 222.

An equivalent circuit diagram of the heating resistor 220 configured as described above is schematically shown in FIG. 8. As shown in FIG. 8, the heating resistor 220 has a connection structure formed from six zones of heating resistor element groups 221A, 221B, 221C, 221D, 222, 223. Of the four heating resistor element groups 221A, 221B, 221C, 221D, for example, the heating resistor element group 221A corresponds to a "first heating resistor element group", the heating resistor element group 221B corresponds to a "second heating resistor element group", the heating resistor element group 221C corresponds to a "third heating resistor element group", and the heating resistor element group 221D corresponds to a "fourth heating resistor element group". In addition, the heating resistor element group 222 corresponds to a "fifth heating resistor element group", and the heating resistor element group 223 corresponds to a "sixth heating resistor element group".

For example, power feed terminals of an AC three-phase power supply are connected via the conductive wires and the power feed members to a total of three power feed terminals 40, i.e., the power feed terminal 40 directly connected to the ends A1, A2, the power feed terminal 40 directly connected to the ends B1, B2, and the power feed terminal 40 directly connected to the ends D1, D2. Thus, it becomes possible to control currents flowing through the heating resistor elements 221A, 221B, 221C, 221D, 222, 223, independently of each other, by using power adjustment means such as a three-phase power adjuster (three-phase thyristor).

Thus, the number of the power feed terminals 40 is only three as compared to six zones of the heating resistor element groups 221A, 221B, 221C, 221D, 222, 223. Therefore, the inner diameter of the shaft 30 can be reduced.

Figure 8:
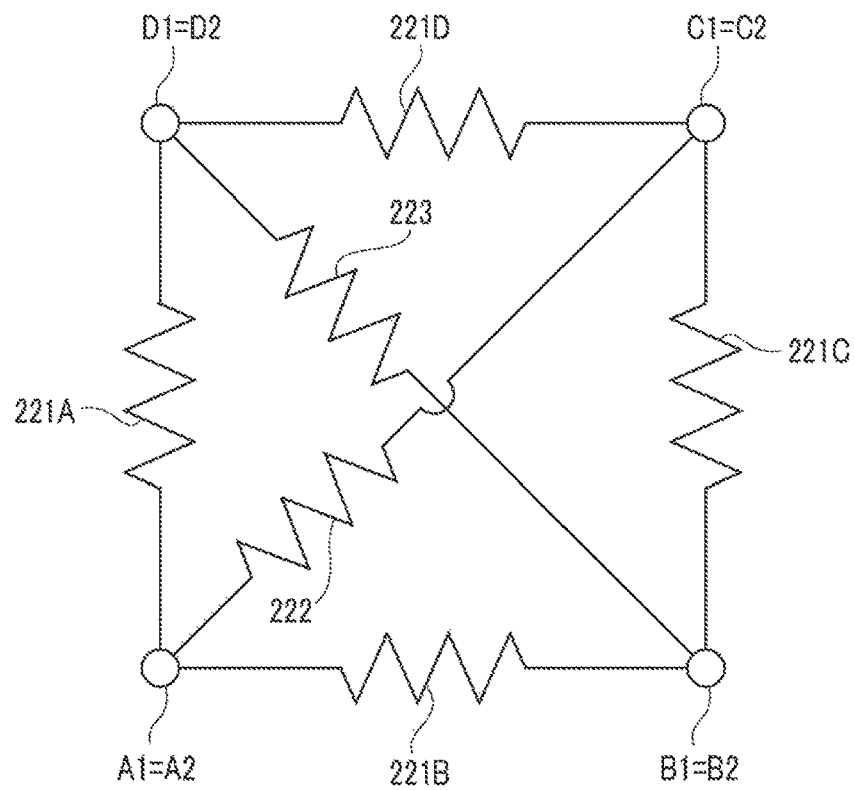
FIG. 8 is a schematic equivalent circuit diagram of a heating resistor.

As is understood from FIG. 8, it is preferable that the heating resistor element groups 221A, 221B, 222 are connected at one point of the end A1 (=A2), for example. However, as is understood from FIG. 6, the heating resistor element groups 221A, 221B are connected at the middle part P of the straight heating resistor element 221A1, and thus a part of the straight heating resistor element 221A1 is shared. Therefore, it is preferable that part from the end A1 to the middle part P has as small a resistance value as possible. The same applies to part from the end B1 to a middle part Q, part from the end C1 to a middle part R, and part from the end D1 to a middle part S.

While the embodiments of the present invention have been described above, the present invention is not limited thereto. For example, the configurations, the shapes, the numbers, and the like of the heating resistor element groups composing each heating resistor are not limited to those described above, and further, the configurations, the shapes, the numbers, the connection positions, and the like of the heating resistor elements composing each heating resistor element group are not limited to those described above.

Figure 3:
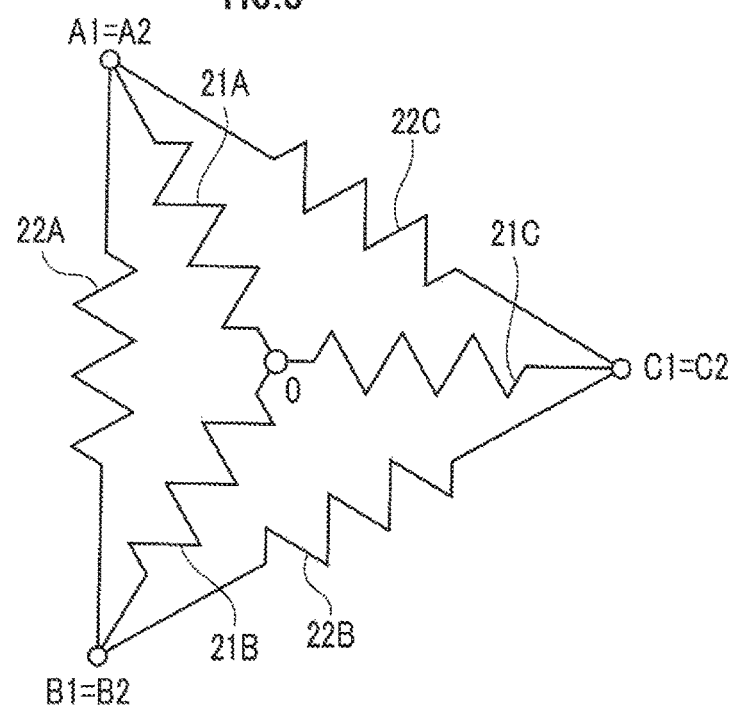
FIG. 3 is a schematic equivalent circuit diagram of a heating resistor.
Figure 11:
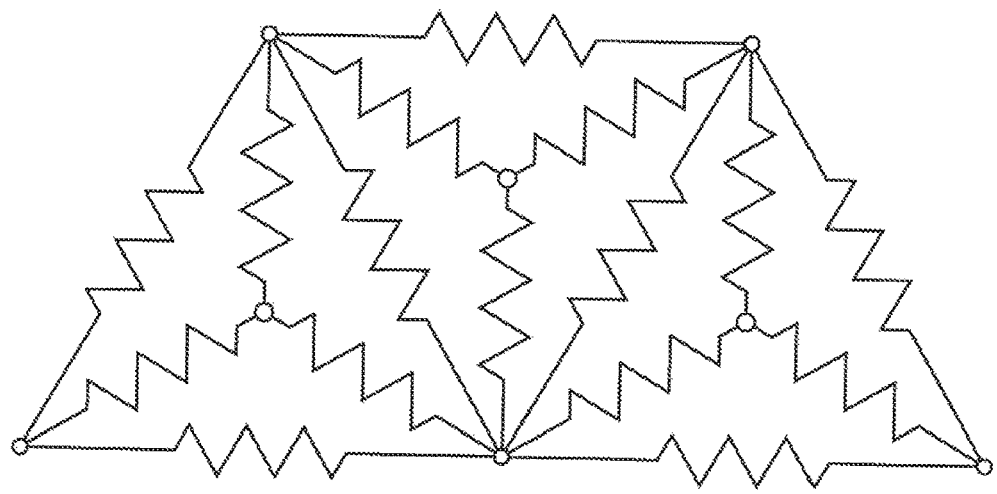
FIG. 11 is a schematic equivalent circuit diagram of another example of a heating resistor.

For example, the heating resistor element groups of the heating resistor may be configured as shown by a schematic equivalent circuit diagram in FIG. 11 like a configuration in which three of the schematic equivalent circuit diagrams of the heating resistor 20 shown in FIG. 3 are connected.

D. Examples

Hereinafter, the present invention will be described with reference to specific examples of the present invention.

In the example, the ceramic heater 100 was obtained using the base body 10 made of aluminum nitride with yttrium oxide added thereto, in which the heating resistor 20 made of metal was embedded.

Manufacturing of Ceramic Heater

A powder mixture composed of 97 mass % of aluminum nitride powder and 3 mass % of yttrium oxide powder was obtained and filled in a mold, to be subjected to uniaxial pressing. Thereby, a first layer having a diameter of 340 mm and a thickness of 10 mm was formed.

Next, on the first layer, a molybdenum mesh (wire diameter: 0.1 mm, size: 50 mesh) having a diameter of 290 mm to become the electrode 20 in the shape shown in FIG. 4 was placed. Subsequently, the previously formed powder mixture was filled at a predetermined thickness on the heating resistor 20, to form a second layer. Then, hot-press sintering was performed at a pressure of 10 MPa and at a sintering temperature of 1800° C. during a sintering period of two hours, to obtain a ceramic sintered body having a diameter of 340 mm and a thickness of 20 mm.

Thereafter, the entire surface of the ceramic sintered body was ground and polished to have a surface roughness Ra of 0.4 μm and a flatness of 0.9 μm.

Then, the upper end surface of the shaft 30 having a cylindrical shape with a length of 200 mm and made of aluminum nitride having a thermal conductivity of 80 kW/(m·k) at normal temperature was joined to the lower surface of the base body 10 by diffusion joining. The dimensions of the cylindrical portion 31 of the shaft 30 were as follows: the inner diameter was 34.14 mm and the outer diameter was 40.14 mm. The outer diameter of the large diameter portion 32 of the shaft 30 was greater than the outer diameter of the cylindrical portion 31 by 20 mm.

Figure 9A:
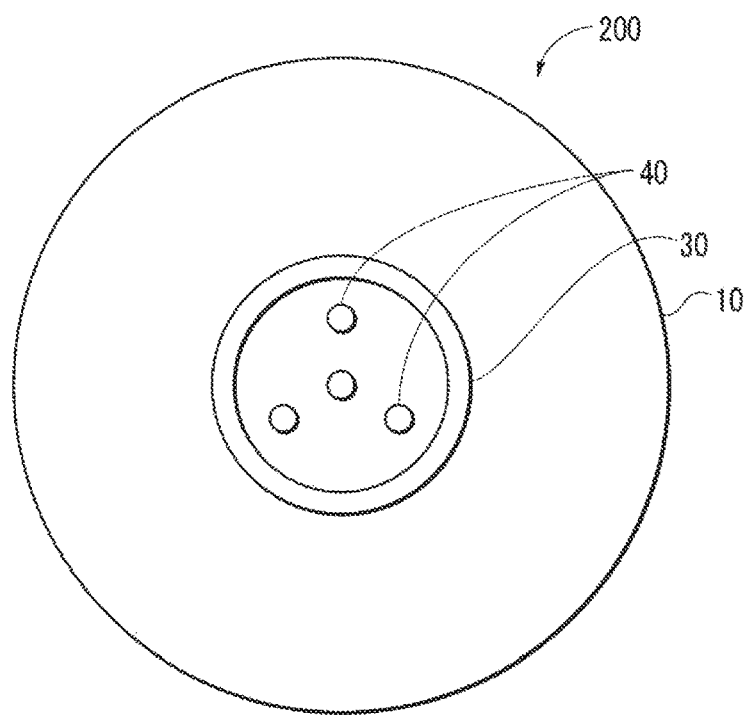
FIG. 9(A) is a schematic bottom view of a ceramic heater in an example.

The number of the terminals 40 was four, and they were arranged as shown in FIG. 9(A). A hole having a diameter of 8 mm was formed from the lower surface of the base body 10 to the heating resistor 20, and a columnar-shape power feed terminal made of nickel and having a diameter of 8 mm was brazed to the exposed heating resistor 20 by silver-alloy brazing, thereby forming each terminal 40.

In this way, the ceramic heater 100 was obtained.

Evaluation Result

A blacked dummy wafer was placed on a wafer placement surface of the ceramic heater 100, power was supplied to the terminals 40 to increase the temperature of the ceramic heater 100, and the surface temperature of the dummy wafer was measured by an infrared camera. The temperature distribution of the dummy wafer was measured 15 minutes later from the time when the surface temperature of the dummy wafer reached approximately 500° C.

Figure 10A:
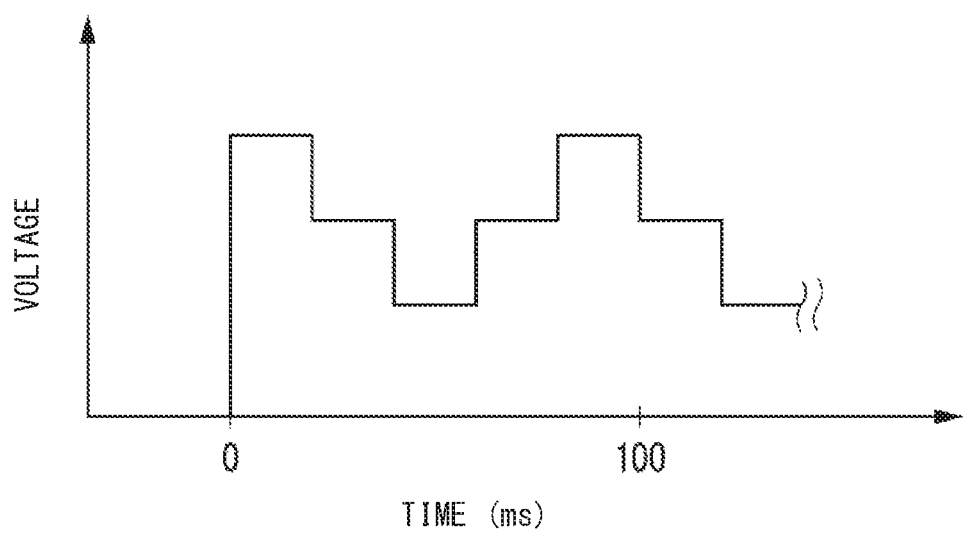
FIG. 10(A) is a graph showing a waveform of voltage supplied between terminals at O and X in the example.
Figure 10B:
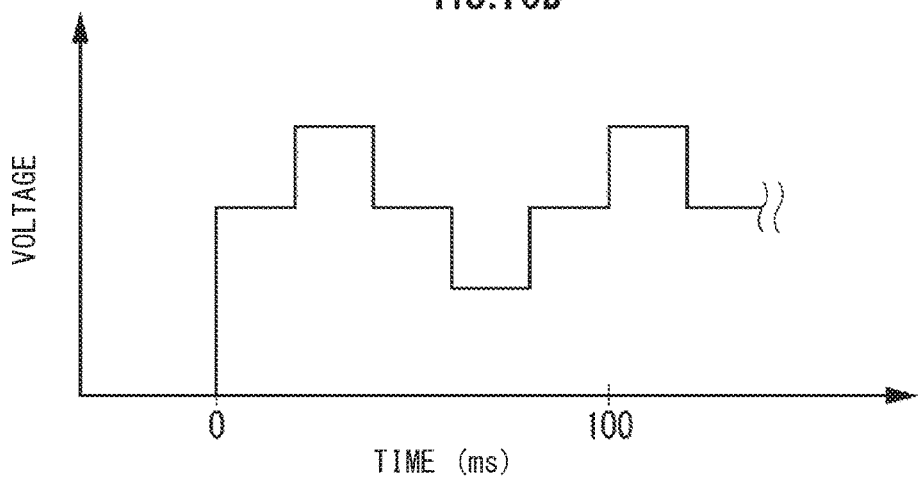
FIG. 10(B) is a graph showing a waveform of voltage supplied between terminals at O and Y in the example.
Figure 10C:
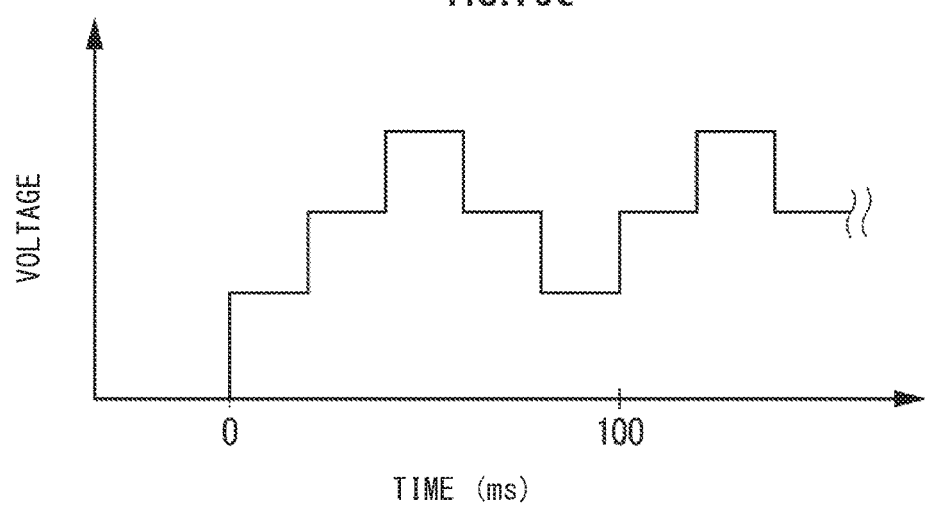
FIG. 10(C) is a graph showing a waveform of voltage supplied between terminals at O and Z in the example.

At that time, voltage having a waveform shown in FIG. 10(A) was supplied between the terminals at O and X, voltage having a waveform shown in FIG. 10(B) was supplied between the terminals at O and Y, and voltage having a waveform shown in FIG. 10(C) was supplied between the terminals at O and Z. The voltages had waveforms varying every 20 ms and having a cycle of 80 ms. The wave heights were adjusted as appropriate so as to uniform the temperature distribution. Without limitation thereto, as a power supply, a known phase control method, a known cycle control (zero cross control) method, or the like may be applied. In addition, either alternating current or direct current may be applied.

An average temperature in the center region (region within a diameter of 20 mm) as a center temperature, and an average temperature in a region within a diameter of 20 mm centered on a position at a radius of 120 mm in 3 o'clock direction, as a peripheral temperature, were compared with each other.

As a result, the center temperature was 502° C. and the peripheral temperature was 505° C. Thus, the thermal uniformity of the ceramic heater 100 was found excellent.

Comparative Example

Figure 9B:
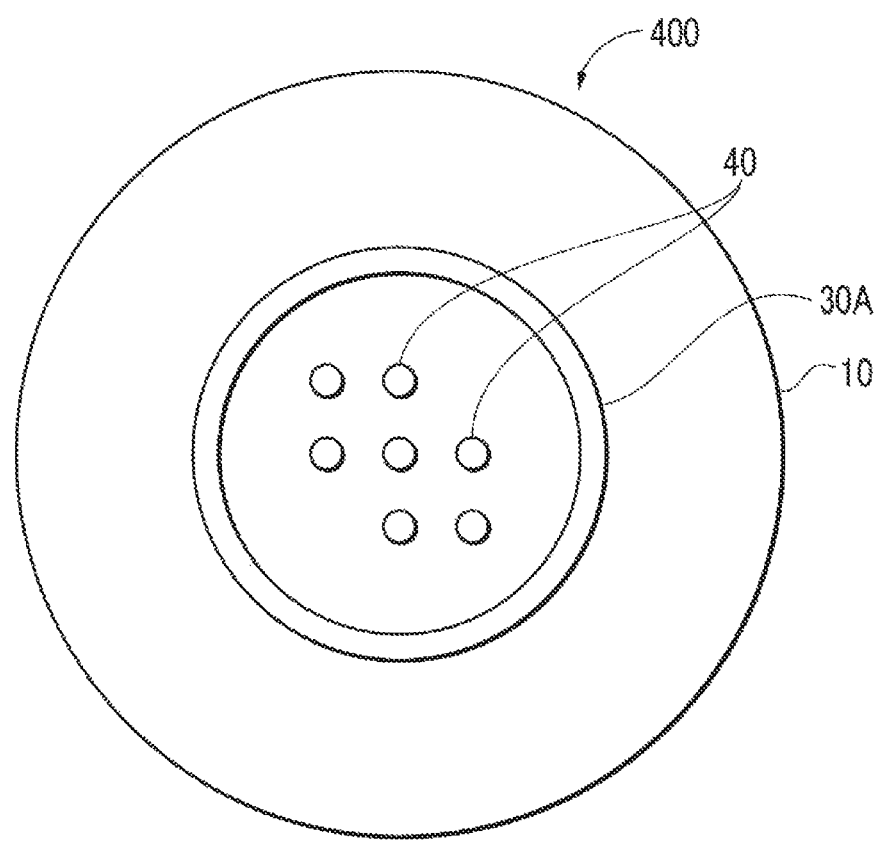
FIG. 9(B) is a schematic bottom view of a ceramic heater in a comparative example.

Seven terminals 40 were arranged as shown in FIG. 9(B). This is because it is necessary to provide six terminals 40 corresponding to six zones of electrodes and one terminal 40 corresponding to a common electrode, i.e., a total of seven terminals 40.

Since a large number of terminals 40 were provided, the shape of the shaft 30 was designed such that the cylindrical portion 31 has an inner diameter of 48.14 mm and an outer diameter of 54.14 mm.

Evaluation Result

The same temperature evaluation method as in the above example was used. As a result, the center temperature was 498° C. and the peripheral temperature was 505° C., and thus a difference therebetween was greater than in the above example.

From comparison between the example and the comparative example, it is considered that, if the number of the terminals increases, heat escape increases due to increase in the sectional area of the shaft, so that the temperature distribution of the heater surface is deteriorated.

It was confirmed that, by decreasing the number of the terminals as in the present invention, the ceramic heater 100 with decreased heat escape can be obtained even if there are a large number of zones and even if the shaft 30 is provided.

According to the present invention, as compared to increase in the number of zones of the heating resistor 20, increase in the number of the power feed terminals 40 can be suppressed, and in addition, the diameter of the shaft 30 can be reduced, so that heat escape from the shaft 30 is suppressed, thus also providing an effect of further improving thermal uniformity.

DESCRIPTION OF REFERENCE NUMERALS

10: base body (ceramic base body)
20, 120, 220: heating resistor
21: lower heating resistor
22: upper heating resistor
21A, 21B, 21C, 22A, 22B, 22C: heating resistor element group
30: shaft (support member)
31: cylindrical portion
32: large diameter portion
40: power feed terminal
100, 200, 300: ceramic heater
120A, 120B, 120C, 120D, 120E, 120F: heating resistor element group
221: lower heating resistor
221A, 221B, 221C, 221D: heating resistor element group
222: middle heating resistor
222A, 222B: heating resistor element group
223: upper heating resistor, heating resistor element group
A1, A2, B1, B2, C1, C2, D1, D2: end
O: center (end)
X, Y, Z: end

What is claimed is:

1. A ceramic heater comprising:
a ceramic base body made of ceramic and having an upper surface on which an object to be heated is to be placed and a lower surface opposite the upper surface;
a cylindrical support member made of ceramic and connected to a center part of the lower surface of the ceramic base body;
a heating resistor embedded in the ceramic base body, the heating resistor including three or more heating resistor element groups, each heating resistor element group including one or more heating resistor elements, at least three of the three or more heating resistor element groups each having a first end and a second end, the first end of each of the at least three of the three or more heating resistor element groups directly connected to the second end of another one of the at least three of the three or more heating resistor element groups and the second end of each of the at least three of the three or more heating resistor element groups directly connected to the first end of a different one of the at least three of the three or more heating resistor element groups; and
power feed terminals connected to, and supplying power to, each of the connected first and second ends of the at least three of the three or more heating resistor element groups.

2. The ceramic heater according to claim 1, wherein
the at least three of the three or more heating resistor element groups are three heating resistor element groups,
the first end of each of the three heating resistor element groups is directly connected to the second end of another one of the three heating resistor element groups, and
other heating resistor element groups different from the three heating resistor element groups ground each of the connected first and second ends of the three heating resistor element groups.

3. The ceramic heater according to claim 1, wherein
the at least three of the three or more heating resistor element groups are four heating resistor element groups,
the first end of each of the four heating resistor element groups is directly connected to the second end of another one of the four heating resistor element groups, and
other heating resistor element groups different from the four heating resistor element groups are connected to each of the connected first and second ends of the four heating resistor element groups.

4. A ceramic heater comprising:
a ceramic base body made of ceramic and having an upper surface on which an object to be heated is to be placed and a lower surface opposite the upper surface;
a cylindrical support member made of ceramic and connected to a center part of the lower surface of the ceramic base body;
a heating resistor embedded in the ceramic base body, the heating resistor including a first heating resistor element group, a second heating resistor element group, and a third heating resistor element group, each of the heating resistor element groups including one or more heating resistor elements and having a first end and a second end, the heating resistor having:

a first end at which the first end of the first heating resistor element group is connected to the second end of the second heating resistor element group;

a second end at which the first end of the second heating resistor element group is connected to the second end of the third heating resistor element group;

a third end at which the first end of the third heating resistor element group is connected to the second end of the first heating resistor element group;

a first power feed terminal connected to, and supplying power to, the first end of the heating resistor;

a second power feed terminal connected to, and supplying power to, the second end of the heating resistor; and a third power feed terminal connected to, and supplying power to, the third end of the heating resistor.

5. The ceramic heater according to claim 4, further including other heating resistor element groups different from the first heating resistor element group, the second heating resistor element group, and the third heating resistor element group; and wherein the first end of the heating resistor, the second end of the heating resistor, and the third end of the heating resistor are each grounded via the other heating resistor element groups different from the first heating resistor element group, the second heating resistor element group, and the third heating resistor element group.

6. A ceramic heater comprising:

a ceramic base body made of ceramic and having an upper surface on which an object to be heated is to be placed and a lower surface opposite the upper surface;

a cylindrical support member made of ceramic and connected to a center part of the lower surface of the ceramic base body;

a heating resistor embedded in the ceramic base body, the heating resistor including a first heating resistor element group, a second heating resistor element group, a third heating resistor element group, and a fourth heating resistor element group, each of the heating resistor element groups including one or more heating resistor elements and having a first end and a second end, the heating resistor having:

a first end at which the first end of the first heating resistor element group is connected to the second end of the second heating resistor element group;

a second end at which the first end of the second heating resistor element group is connected to the second end of the third heating resistor element group;

a third end at which the first end of the third heating resistor element group is connected to the second end of the fourth heating resistor element group; and a fourth end at which the first end of the fourth heating resistor element group is connected to the second end of the first heating resistor element group;

a first power feed terminal connected to, and supplying power to, the first end of the heating resistor;

a second power feed terminal connected to, and supplying power to, the second end of the heating resistor;

a third power feed terminal connected to, and supplying power to, the third end of the heating resistor; and a fourth power feed terminal connected to, and supplying power to, the fourth end of the heating resistor.

7. The ceramic heater according to claim 6, further comprising:

a fifth heating resistor element group different from the first heating resistor element group, the second heating resistor element group, the third heating resistor element group, and the fourth heating resistor element group, and a sixth heating resistor element group different from the first heating resistor element group, the second heating resistor element group, the third heating resistor element group, the fourth heating resistor element group, and the fifth heating resistor element group;

wherein the first end of the heating resistor and the third end of the heating resistor are connected via the fifth heating resistor element group, and the second end of the heating resistor and the fourth end of the heating resistor are connected via the sixth heating resistor element group.

8. A ceramic heater comprising:

a ceramic base body made of ceramic and having an upper surface on which an object to be heated is to be placed and a lower surface opposite the upper surface;

a cylindrical support member made of ceramic and connected to a center part of the lower surface of the ceramic base body;

a heating resistor embedded in the ceramic base body, the heating resistor including three or more heating resistor element groups, each heating resistor element group including one or more heating resistor elements, at least three of the three or more heating resistor element groups each having a first end and a second end, the first end of each of the at least three of the three or more heating resistor element groups directly connected to the second end of another one of the at least three of the three or more heating resistor element groups; and power feed terminals connected to, and supplying power to, each of the connected first and second ends of the at least three of the three or more heating resistor element groups;

wherein the at least three of the three or more heating resistor element groups are three heating resistor element groups, the first end of each of the three heating resistor element groups is directly connected to the second end of another one of the three heating resistor element groups, and other heating resistor element groups different from the three heating resistor element groups ground each of the connected first and second ends of the three heating resistor element groups.

9. A ceramic heater comprising:

a ceramic base body made of ceramic and having an upper surface on which an object to be heated is to be placed and a lower surface opposite the upper surface;

a cylindrical support member made of ceramic and connected to a center part of the lower surface of the ceramic base body;

a heating resistor embedded in the ceramic base body, the heating resistor including three or more heating resistor element groups, each heating resistor element group including one or more heating resistor elements, at least three of the three or more heating resistor element groups each having a first end and a second end, the first end of each of the at least three of the three or more heating resistor element groups directly connected to the second end of another one of the at least three of the three or more heating resistor element groups; and power feed terminals connected to, and supplying power to, each of the connected first and second ends of the at least three of the three or more heating resistor element groups;

wherein the at least three of the three or more heating resistor element groups are four heating resistor element groups, the first end of each of the four heating resistor element groups is directly connected to the second end of another one of the four heating resistor element groups, and other heating resistor element groups different from the four heating resistor element groups are connected to each of the connected first and second ends of the four heating resistor element groups.

* * * * *